United States Patent
Fouassier (10) Patent No.: US 10,325,052 B1
(45) Date of Patent: Jun. 18, 2019

(54) METHOD AND SYSTEM FOR IMPLEMENTING CUSTOM INTER-LAYER TRANSITIONS FOR A MULTI-LAYER BUS

(71) Applicant: Cadence Design Systems, Inc., San Jose, CA (US)

(72) Inventor: Christophe Fouassier, Valbonne (FR)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 155 days.

(21) Appl. No.: 15/266,961

(22) Filed: Sep. 15, 2016

(51) Int. Cl.
*G06F 17/50* (2006.01)

(52) U.S. Cl.
CPC ............... *G06F 17/5077* (2013.01)

(58) Field of Classification Search
CPC ............ G06F 17/5068; G06F 17/5077; G06F 17/5081; G06F 2217/82; G06F 2217/84; G06F 2217/78; G06F 17/50; G06F 17/5072
USPC ................. 716/126, 129–130, 132–135, 139
See application file for complete search history.

(56) References Cited

U.S. PATENT DOCUMENTS

| | | | |
|---|---|---|---|
| 7,197,738 B1 | 3/2007 | Hetzel et al. | |
| 7,536,665 B1 * | 5/2009 | Horlick | G06F 17/5077 716/126 |
| 8,046,730 B1 * | 10/2011 | Ferguson | G06F 17/5068 716/100 |
| 8,510,702 B2 * | 8/2013 | Bosshart | G06F 17/5077 716/128 |
| 8,719,746 B1 * | 5/2014 | Davidovic | G06F 17/5077 716/112 |
| 8,983,804 B2 * | 3/2015 | Houdouin | G06F 17/50 703/1 |
| 9,208,277 B1 | 12/2015 | Lamant | |
| 9,213,793 B1 | 12/2015 | Salowe | |
| 9,251,299 B1 | 2/2016 | Salowe | |
| 2005/0240894 A1 | 10/2005 | Teig et al. | |
| 2006/0261043 A1 * | 11/2006 | Betz | G06F 17/5068 218/3 |
| 2011/0061039 A1 * | 3/2011 | Kumagai | G06F 17/5077 716/126 |
| 2011/0099530 A1 | 4/2011 | Lamant | |
| 2013/0205274 A1 * | 8/2013 | Bosshart | G06F 17/5068 716/139 |

* cited by examiner

*Primary Examiner* — Nghia M Doan
(74) *Attorney, Agent, or Firm* — Foley & Lardner LLP (57) ABSTRACT

The present embodiments relate generally to techniques for creating and/or modifying multi-layer buses in an IC design. According to some more particular aspects, embodiments relate to techniques for allowing an IC designer to efficiently transition a multi-layer bus section made of N wires and M layers to another multi-layer bus section made of N wires and any other M' layers. In some embodiments, the user describes, programmatically, one or several custom transitions called a custom transition procedure and saved in a human-readable text file that can also be read by a layout editor tool. By a command associated with the custom transition procedure that is exposed to the user in the layout editor tool, a multi-layer bus is automatically transitioned from a set of layers to another.

13 Claims, 5 Drawing Sheets

METHOD AND SYSTEM FOR IMPLEMENTING CUSTOM INTER-LAYER TRANSITIONS FOR A MULTI-LAYER BUS

TECHNICAL FIELD

The present disclosure relates generally to integrated circuits, and more particularly to techniques for efficiently implementing inter-layer transitions of a bus in an integrated circuit design.

BACKGROUND

Designing an integrated circuit (IC) has been made considerably easier by the availability of electronic design automation (EDA) tools. An IC can include billions of devices, and can comprise ten to sixteen layers of conductor material. EDA tools allow a designer to describe an integrated circuit based on its desired behavior, and then transform that behavioral description into a set of geometric shapes corresponding to the devices for each of the layers, the set of shapes being called a layout. Included among all the stages of designing an IC, devices must be placed into a floor plan. The devices are then interconnected together with wires made of a conductor material, which are also comprised of geometric shapes that are included in the layout.

Wires can also be interactively created by a designer using EDA tools (e.g., a layout editor tool). When creating a wire on a specific layer, the designer might want to continue the wire on a different layer by transitioning the wire from one layer to another. Conventional EDA tools are capable of allowing the user to do this fairly easily for individual wires and transitions, but for busses containing up to several hundred wires and several different layer transitions, the processes provided by conventional EDA tools can be time consuming and error-prone.

SUMMARY

The present embodiments relate generally to techniques for creating and/or modifying multi-layer buses in an IC design. According to some more particular aspects, embodiments relate to techniques for allowing an IC designer to efficiently transition a multi-layer bus section made of N wires and M layers to another multi-layer bus section made of N wires and any other M' layers. In some embodiments, the user describes, programmatically, one or several custom transitions called a custom transition procedure and saved in a human-readable text file that can also be read by a layout editor tool. By a command associated with the custom transition procedure that is exposed to the user in the layout editor tool, a multi-layer bus is automatically transitioned from a set of layers to another.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the invention. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to techniques for creating and/or modifying multi-layer buses in an IC design, including techniques for allowing an IC designer to efficiently transition a multi-layer bus section made of N wires and M layers to another multi-layer bus section made of N wires and any other M' layers.

Figure 1:
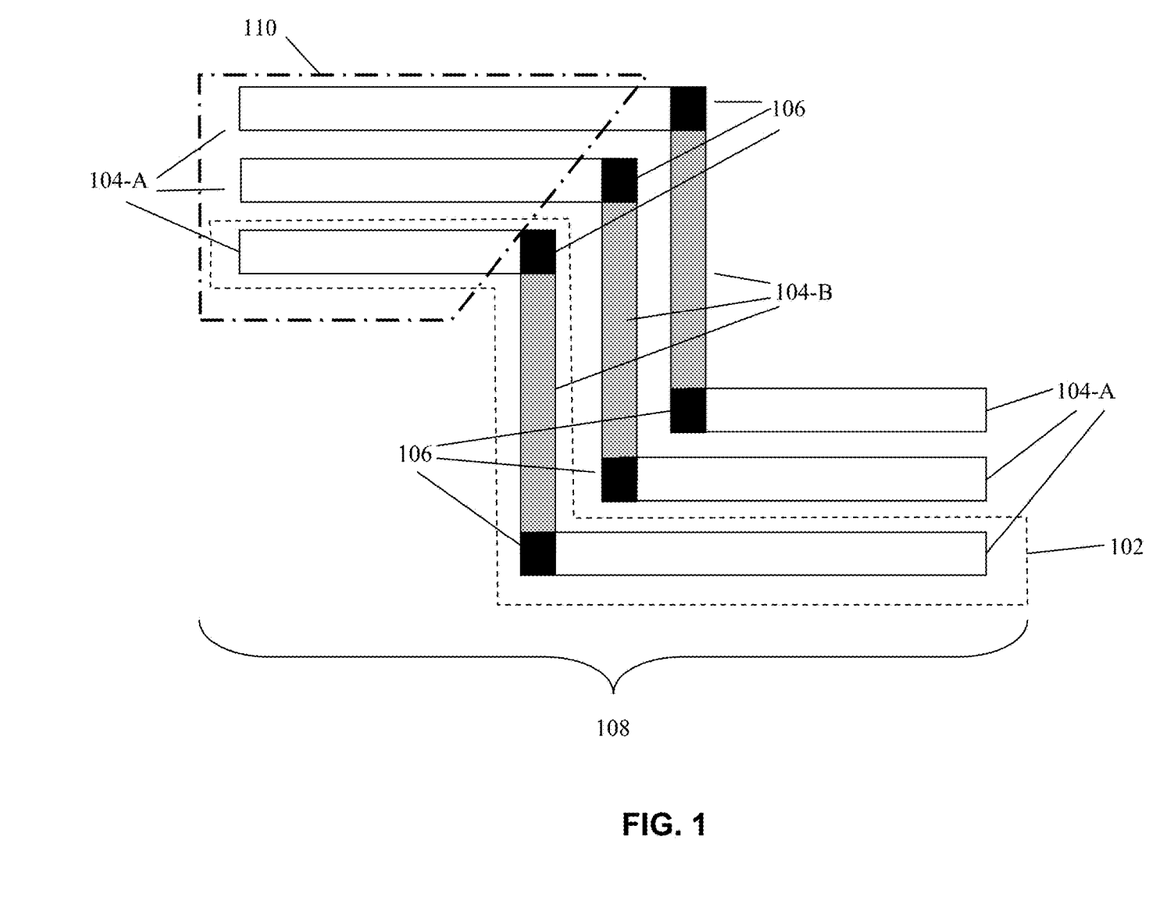
FIG. 1 is a diagram illustrating example aspects of transitions in an IC design according to the present embodiments.

FIG. 1 is a diagram illustrating example aspects of the present embodiments.

For purposes of the present disclosure, a wire 102 is a set of interconnected shapes 104 and vias 106, all of which are electrically equivalent. A bus 108 is a set of wires 102. In the example of FIG. 1, the three wires 102 forming bus 108 are each comprised of shapes 104-A formed in one layer, and shapes 104-B formed in a separate layer (e.g., an adjacent layer of an IC using a single via 106 or on a non-adjacent layer using two or more stacked vias). As can be further seen in FIG. 1, wires in a bus share the same topology.

A bus section 110 is a portion of a bus between vias. A single layer section is a bus section where all the wire shapes share the same layer. When all bus sections of a bus are single layer sections as shown in the example of FIG. 1, the bus is called a single layer bus. Otherwise it is called a multi-layer bus.

Figure 2A:
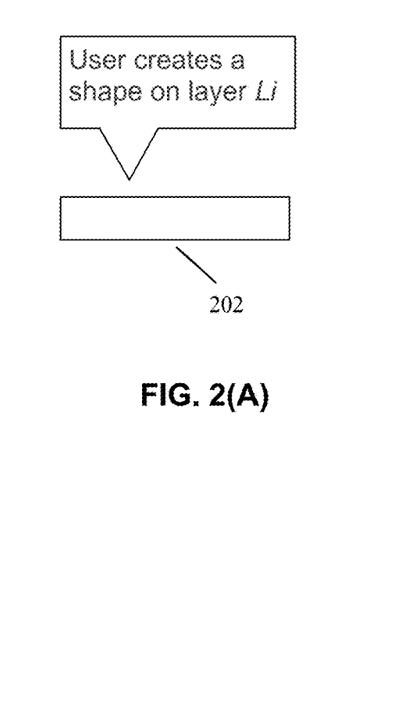
FIGS. 2(A), 2(B) and 2(C) are diagrams illustrating additional example aspects of adding transitions in an IC design.
Figure 2B:
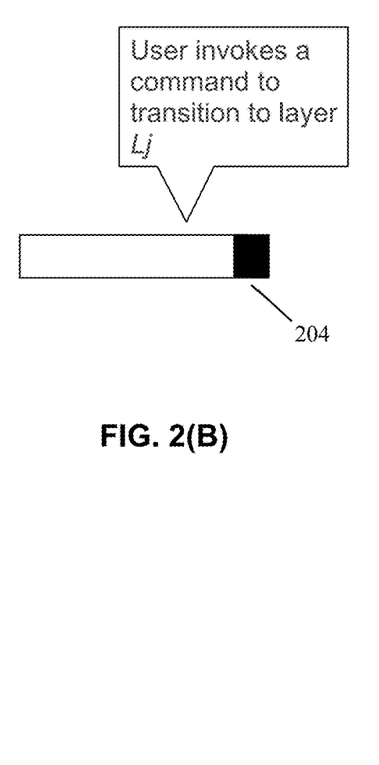
Figure 2C:
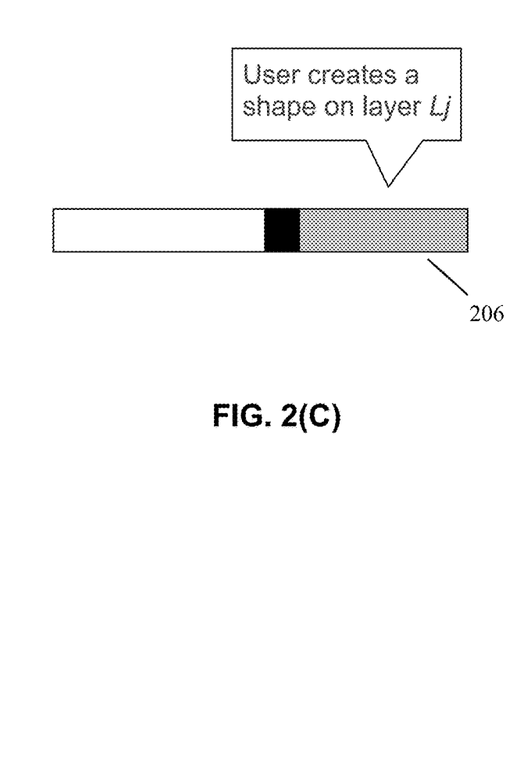

As set forth above, wires and busses can be interactively created using EDA tools (e.g., a layout editor tool). As further set forth above, when creating a wire on a specific layer, the user might want to continue the wire on a different layer. For example, as shown in FIG. 2(A), a user creating a wire first creates a shape 202 on a first layer Li. Conventional layout editor tools provide commands to transition the wire to another layer by inserting a via (or via stack) between the current shape and the next shape. Accordingly, as shown in FIG. 2(B), after creating the shape 202, the user invokes the appropriate command to transition the wire to a different layer Lj and the tool automatically inserts a via 204 (or via stack) between the two layers Li and Lj. The tool further automatically allows the user to begin creating shapes corresponding to the wire in the next layer Lj. So, as shown in FIG. 2(C), the user can then continue creating the wire in layer Lj by creating a next shape 206 in layer Lj.

In some examples of conventional EDA tools, if the user is creating a wire or a single layer bus, a shape corresponding to the wire on a specific layer Li such as shape 202 in FIG. 2(A) (or set of shapes for a single bus section) is interactively displayed in the layout editor tool. From that state, the user can transition the wire or the single layer bus to another layer by invoking a command (e.g., by selecting the command from a pull-down menu or similar user interface mechanism) and giving only one piece of information to the tool—the layer Lj. For example, in response to the user invoking the command, the tool can provide a pop-up form or similar user interface mechanism listing other layers of the IC. In that form, the user can then select the layer Lj (e.g., by point and click on a button corresponding to that layer). In summary, when creating a wire or a single layer bus, any transition can be performed with just two user actions on the tool. The first action involves invoking a command which opens a form listing available layers and the second action involves the user picking the layer to which the wire should be transitioned.

In an IC, layers are typically numbered in ascending order from the bottom layer to the top layer. Any layer has an adjacent upper and a lower layer, except the bottom layer which has only an adjacent upper layer, and the top layer which has only an adjacent lower layer. When transitioning a wire or a single layer bus, the form or other similar user interface mechanism presented by the layout editor tool typically provides various options to transition the current shape or set of shapes on the current layer Li. For example, from one layer, the tool can provide a form listing all of the layers in the IC. From that form, the user can choose any layer he wants to transition to. Additionally or alternatively, the tool can provide special commands to transition to the available adjacent layers of the current layer.

If the user is creating a multi-layer bus, commands that are the same or similar to those used to transition a wire or a single layer bus can be used to transition the multi-layer bus. For example, a multi-layer bus can be transitioned such that all wires of the bus are transitioned from their respective layers to a single common layer. As a result, the bus section before the transition is a multi-layer section and the section after the transition is a single layer section. A multi-layer bus can also be transitioned such that all wires of the bus are transitioned from their respective layers to either their adjacent upper or lower layer.

However, these commands do not allow the user to transition from any multi-layer section to any other multi-layer section. From a multi-layer bus state, only three new states can be reached with these commands in conventional EDA tools while there are N*M possible reachable states (where N is the number of wires in the bus and M is the number of layers in the IC).

In order to be able to perform any of these possible transitions, the layout editor tool could provide a form in response to a transition command being invoked in which all wires of the currently created bus are listed. Then for each wire, the user could select the layer to which the wire should transition to. However, a bus can potentially hold several hundreds of wires. Moreover, a bus is typically comprised of several different transitions. As a result, conventional methods which require a user to fill in the same form for several hundred different wires for each transition can be tedious, time consuming and error prone.

Embodiments, therefore, relate to more efficient techniques than those available in conventional approaches for allowing an IC designer to create/modify and implement any desired set of inter-layer transitions for multi-layer busses having any number of wires in an integrated circuit design.

Figure 3:
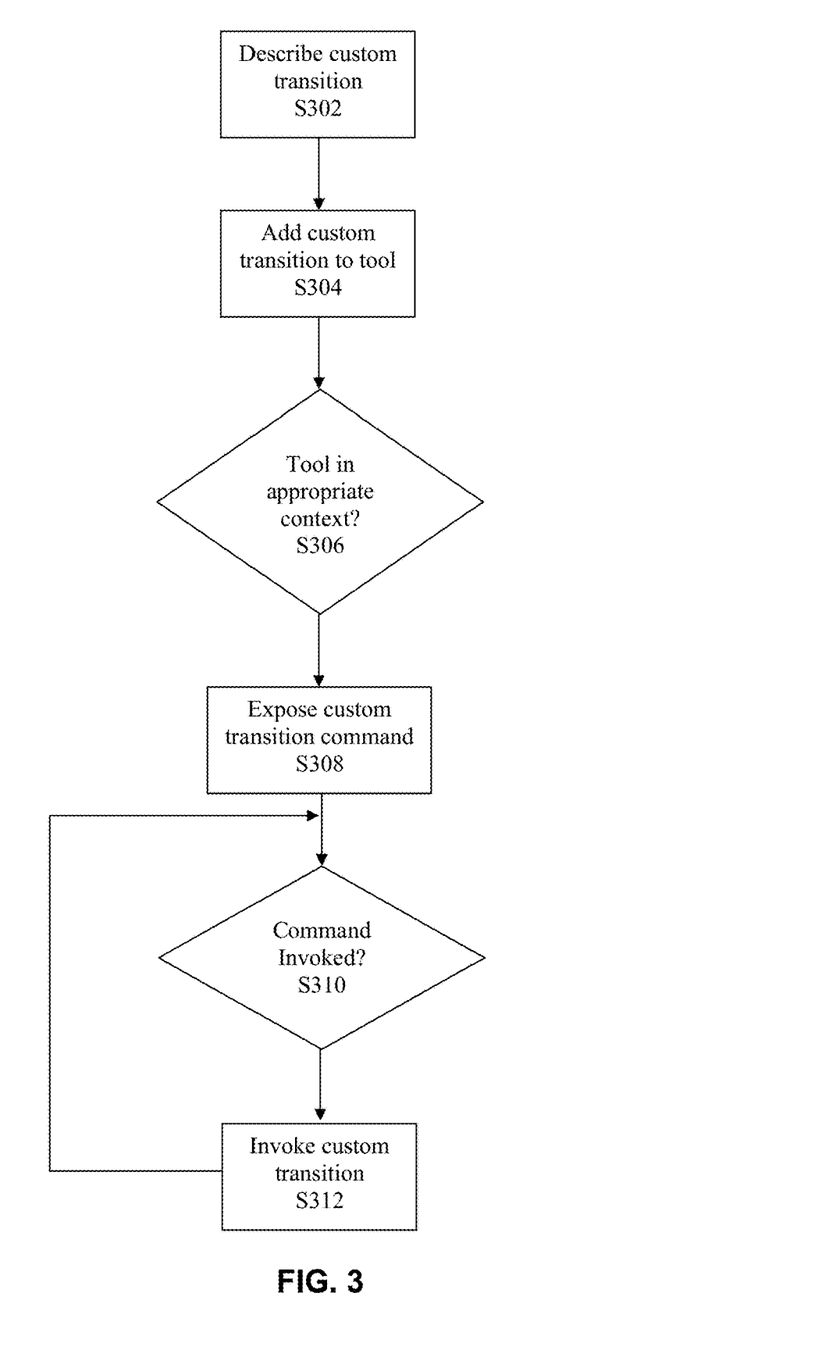
FIG. 3 is a flowchart of an example methodology for creating and using a custom set of inter-layer transitions for a multi-layer bus according to the present embodiments.

FIG. 3 is a flowchart illustrating an example methodology according to the present embodiments.

In a first step S302, a user describes a desired custom transition for a multi-layer bus section. This description is called a custom transition procedure. In embodiments, a custom transition procedure is human readable text, written with a programming language that the layout editor tool understands. For example, some EDA tools provide a console in which a user can write commands using an interpreted programming language. These human-readable commands are interpreted and can then be executed by the tool. The interpretation is a process which translates the human readable text to computer instructions and can be performed automatically when a user hits the "Return" key in the console, for example. Some example interpreted languages incorporated into EDA tools are TCL and Lisp. Those skilled in the art will be able to understand how to implement the present embodiments by adapting such consoles and interpreted languages after being taught by the present disclosure.

In embodiments, a custom transitions procedure consists of a procedure name, a procedure core and procedure interfaces, all specified and/or written by the user. An example programming language format for a custom transition procedure according to the present embodiments is presented below in TABLE 1.

TABLE 1

Procedure Procedure_Name ( Procedure_Input_Interface)
{
   Procedure Core
   return Procedure_Output_Interface
}

The procedure name is an unique identifier. It conforms to a programming language convention (example: no space/no special characters/ . . . ). The name is used to bind the tool with the procedure.

The procedure interfaces include an input interface and an output interface. When establishing a communication with the procedure, the tool will use the input interface to communicate useful data to the procedure. In return, the procedure will use the output interface to communicate back to the tool. Both interfaces preferably respect a specification such that both parties (tool and procedure) can communicate.

For example, in embodiments, using the specified input interface, the procedure receives from the tool one argument describing the current multi-layer bus state. This single argument is a list made of N elements where N is the number of wires of the multi-layer bus. Each element in the list includes an identifier of the corresponding wire (e.g., wire_id1, wire_id2 . . . wire_idN) and the current layer in which that particular wire of the bus is placed.

In embodiments, using the specified output interface, the procedure returns to the tool a value describing the transition. This value is a list of layers indicating the next layer for each wire. If, with respect to the above example input interface specifying N wires, the returned list has N layers, there is a one to one mapping between the wire identifiers and the returned layers. In this case, the nth wire listed in the input interface must transition to the nth layer listed in the output interface. If the returned list has a different number N' layers such that 1<=N'<N, the return value is a pattern. The tool repeats this pattern for at least the first N' wires and then cycles back to the beginning of the list and through it again until all wires have a layer to transition to. If the specified output interface has no returned value or if the returned value has more than N layers, it is an error and the tool does not perform any transitions.

The procedure core includes instructions to describe the desired transition. More particularly, for each wire of the multi-layer bus, the user describes how to compute the next layer to which that wire is to transition from the current layer. The user creates the procedure core using the syntax of the programming language. For example, all layers have an identifier in the tool and as such the user can use this identifier in the tool's console. A layer identifier is typically a string (e.g., "Metal1", "Metal2", . . . ) or an integer (e.g. 12, 14, 16, . . . ). An example to transition wire 'wireId1' from layer Li to Li+1 could thus be written as:

```
foreach (wireLayerPair in wireLayerPairs)
{
  if (wire of wireLayerPair == wireId1) then
    if (layer of wireLayerPair == "Metal1" then
      newLayerOfWireId1 = "Metal2"
    ) else if ((layer of wireLayerPair == Metal2" then
      newLayerOfWireId1 = "Metal3"
    ) else if (...)
    ...
  )
}
```

It should be noted that there can be many ways to create a procedure according to embodiments. For example, a conventional EDA tool can be adapted to include additional user interface functionality to allow a user to create and edit a procedure and to store the custom procedure in a file and location that is predetermined by the EDA tool. In other examples, the procedure can be created partially or fully using a standalone text editing program. Those skilled in the art will be able to appreciate these and other alternatives after being taught by the present examples.

In a next step S304, the custom transition procedure is loaded into the tool. For example, the location and name of a file containing the procedure is added to a predetermined list of names and locations of files associated with custom transition procedures. In another example, the EDA tool can provide a mechanism to load a user file that defines procedures with an interpreted programming language such as that described above. In such an example, a file defining a custom transition procedure can be loaded using a command such as "load("/full/path/of/the/file")". After being loaded, the tool allows a custom transition command to be created for the custom transition procedure. The tool further provides three commands to manage custom transition commands: addCustomTransitionCommand, removeCustomTransitionCommand, and listCustomTransitionCommands. For example, a console for an EDA tool can be adapted such that users can write commands which will be processed by the tool. These new commands can then be invoked from the console.

The "addCustomTransitionCommand" command accepts two arguments. The first one is a custom transition procedure name. The second one is a custom transition name. While the custom transition procedure name has to conform with the programming language syntax as set forth above, the custom transition name has fewer restrictions. Only the latter name will be exposed to the user by the tool. As a result, the user will be not exposed to the programming language limitations. "addCustomTransitionCommand" creates a new command in the tool.

"removeCustomTransitionCommand" command accepts one argument, a custom transition procedure name. If the custom transition procedure name is bound to a custom transition command, this command is removed from the tool.

"listCustomTransitionCommands" command does not accept any arguments. It lists all custom transition commands that have been created previously.

Step S308 is shown to represent example embodiments where custom transitions are designed during a particular context in which an EDA tool is being used to design an integrated circuit. For example, adding vias to the current shape being created only makes sense when a user is actually using a tool feature that allows for shape creation. In such an example, the custom transition command will be only visible in a user interface of the EDA tool when a user is creating shapes. The custom transition commands can then be made available from the layout window of the user interface, such as from a pull-down menu.

Accordingly, the state of step S310 is entered where the custom transition command is exposed to the user. For example, the tool can provide a context menu in its user interface (e.g., a drop-down or similar user interface mechanism) that shows all custom transition commands that have been created by the user. In embodiments, each custom transition in the context menu has an associated user interface button. Clicking on a button invokes the corresponding custom transition command. The user has the ability to customize the context menu by adding or removing custom transition commands as set forth above in connection with step S304. The user can also choose to only display custom transition commands which are relevant in his current context or display all of them that he/she created.

In step S310 the tool determines whether a custom transition command has been invoked, such as by clicking a user interface button in a menu as set forth above.

When a custom transition command is invoked, in step S312 the tool calls the corresponding custom transition procedure, giving it the current state of the multi-layer bus that the user is working on using the tool. When the procedure returns a valid list of layers, the tool creates the transition by automatically adding vias to the wires of the multi-layer bus and displaying the newly added shapes in the tool. So according to aspects of the present embodiments, for any multi-layer bus, only two actions are needed to create a desired set of inter-layer transitions for all of the wires in the bus. First, the user invokes the context menu. Second, he chooses one of the available custom transition commands.

Figure 4:
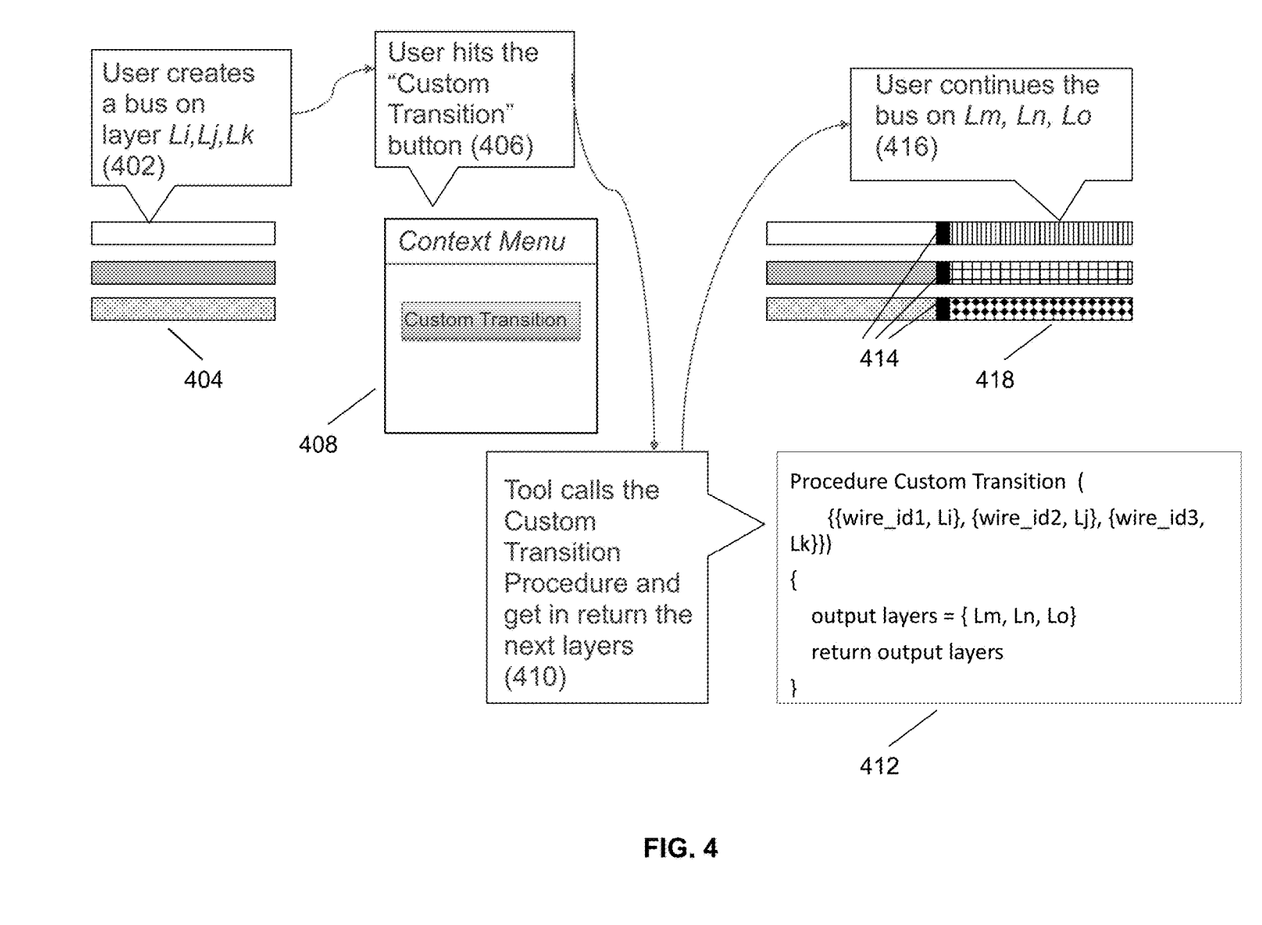
FIG. 4 is a diagram illustrating aspects of using a custom set of inter-layer transitions for a multi-layer bus by invoking a command in a layout editor tool according to the present embodiments.

FIG. 4 is a diagram illustrating example aspects of invoking a custom transition command that can be used to implement a step S312 according to the present embodiments.

For example, in 402 a user of a layout editor tool according the present embodiments creates a bus 404 having three wires in three different layers Li, Lj and Lk in a conventional manner and displayed for the user in a user interface. In 406, after creating bus 404, the user accesses a user interface context menu (e.g., by clicking on a drop-down menu) that has been updated with available buttons such as button 408 corresponding to a custom transition command that has been added to the context menu in a manner as described above, for example.

In 410 the user clicks the button 408, and in response the tool calls the corresponding loaded custom transition procedure for the custom transition command. As set forth above, in example embodiments, the procedure 412 is included in a human readable text file. It should be noted that a file can hold one or multiple custom transition procedures. Moreover, usually a name in a programming language cannot have space. For example, a procedure name could be "Custom_Transition" (without a space). So when calling "addCustomTransitionCommand" for a procedure in the file, a user can choose a different user friendly name: for example addCustomTransitionCommand("Custom_Transition", "Custom Transition"). By doing so, the user binds the procedure "Custom_Transition" to the user friendly name "Custom Transition". This user-friendly name can have any special character which is not usually allowed by the programming language to name a procedure.

As shown, procedure 412 has an input interface listing three wires and associated layers. The procedure 412 receives the current state of the bus from the tool, in this example that first wire wire_id1 is currently placed in layer Li, second wire wire_id2 is currently placed in layer Lj and third wire wire_id3 is currently placed in layer Lk. The procedure core of 412 specifies that the three wires should be respectively placed in new layers Lm, Ln and Lo, and these output layers are provided back to the tool via the output interface "output layers". In response the tool automatically creates vias 414 respectively between the first wire in Li and layer Lm, the second wire in Lj and Ln and the third wire in Lk and Lo and displays the results in the user interface display. In 416, the user can then continue the multi-layer bus for each of these three wires by adding multi-layer section 418 including shapes in the respective layers.

Figure 5:
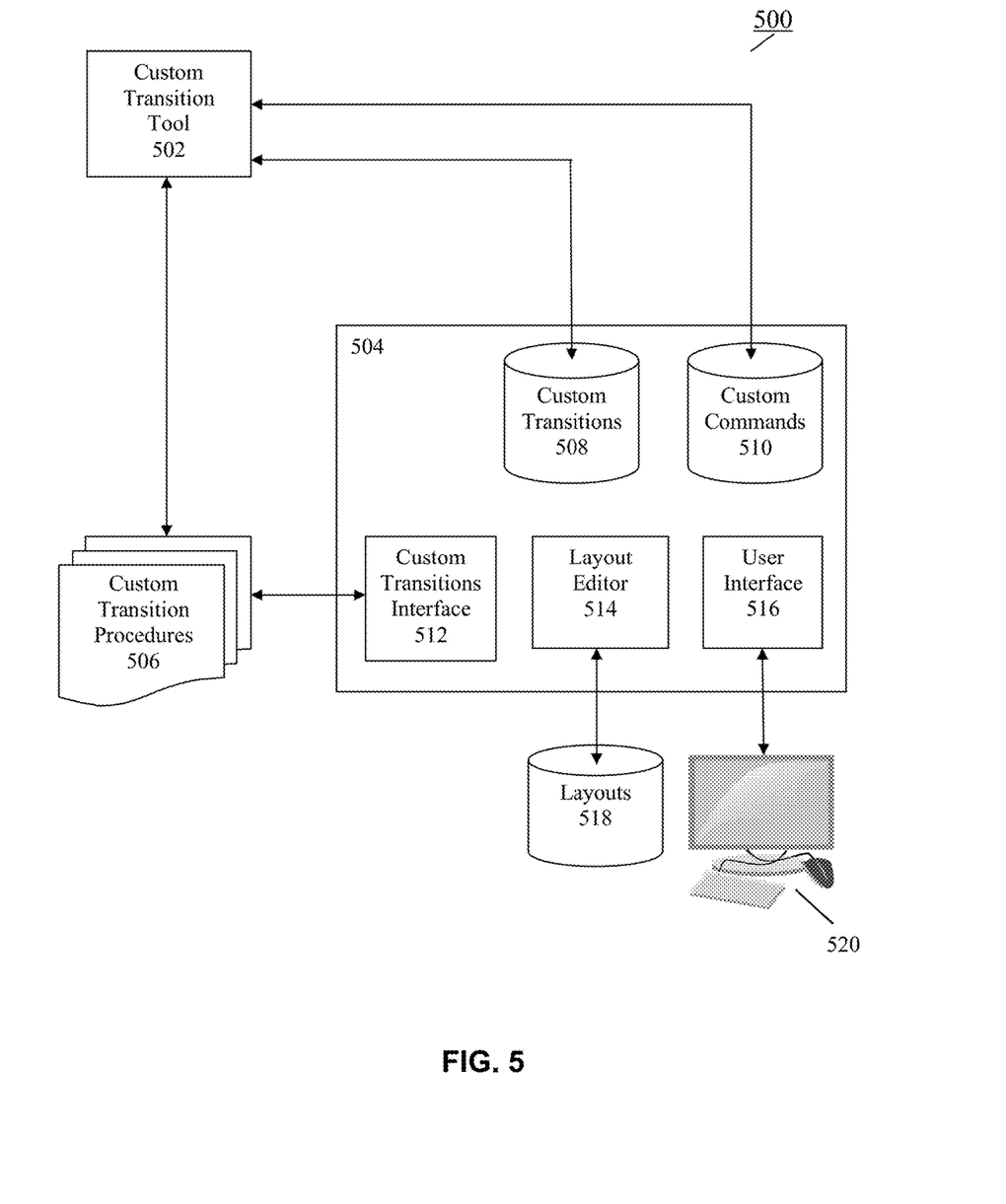
FIG. 5 is a block diagram of an example system according to the present embodiments.

FIG. 5 is a block diagram illustrating an example system according to the present embodiments.

As shown, the system includes a custom transition tool 502 and EDA tool 504. These are shown separately for ease of illustration. However, custom transition tool 502 may be included with EDA tool 504 within a common set of software and/or hardware and/or combinations thereof. For example, system 500 can be an EDA tool that is adapted to include the functionalities of custom transition tool 502 according to the present embodiments. Alternatively, custom transition tool 502 may be partially or fully implemented as a standalone software application that is adapted to communicate with EDA tool 504 via various communication mechanisms that are known to those skilled in the art.

In these and other embodiments, EDA tool 504 may include additional interactive or automated modules for interactively implementing physical electronic designs that are not shown such as a placer, a routing engine, a design rule checker, a verification engine, or a floorplanner, etc. as will be appreciated by those skilled in the art. In other embodiments, EDA tool 504 is a standalone application that only includes layout editor functionality and/or is adapted to communicate with other automated EDA modules.

In embodiments, system 500 can be implemented by one or more general purpose computers that are loaded with an operating system executing software and/or customized to include hardware for interactively implementing physical electronic designs and adapted with the custom transitions functionality of the present disclosure. In some embodiments, the one or more computing systems comprise various components not shown such as the processor(s) or processor core(s), memory, disks, etc. The one or more computing systems may further write to and read from a local or remote volatile or non-volatile computer accessible storage not shown that stores thereon data or information such as, but not limited to, one or more databases such as schematic design database(s) or physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software (e.g., a layout editor tool) for implementing some or all of the methodology of the present embodiments, and one or more client computers can communicate with the server computer(s) via a network to perform some or all of the methodology of the embodiments for a particular design.

In operation, a user can use custom transition tool 502 via a user interface mechanism (e.g., a console) to create or edit custom transition procedures 506, for example the custom transition procedures having a format as described above and using the methodology described above. In these and other embodiments, the procedures include human readable text (e.g., an ASCII file) and can be stored in a directory of files that is mutually accessible to tool 502 and tool 504. In response to user actions to create or edit custom transition procedures, custom transition tool 502 updates a list of custom transition procedures 508 (e.g., the identity and locations of the associated files in a directory) and custom transition commands 510 that are maintained by EDA tool 504, for example using a methodology and custom transition command management commands described in more detail above.

In operation of EDA tool 504, when layout editor 514 is being used to create or modify multi-layer buses in a layout stored in layouts 518, the available custom transitions are read from 508 and the available custom transition commands 510 are exposed to the user via user interface 516 (e.g., user interface 516 populates drop-down or other similar user interface mechanisms using the information in custom transition commands 510). It is important to note that, according aspects of the embodiments, these custom transition commands 510 are in addition to pre-existing and built-in commands (e.g., commands for performing single wire or other conventional transitions such as those described above) of the EDA tool 504 and layout editor 514.

In further operation of EDA tool, using the methodology described above, for example, in response to user actions in connection with custom transition commands (as conducted using interface devices 520 and user interface 516), layout editor 514 uses custom transition interface 512 to access the appropriate custom transition procedure 506 to automatically perform the desired custom transition in the current layout and display the results to the user via user interface devices 520 and user interface 516. In the illustrated example, layout editor 514 accesses the procedures via interface 512, which is aware of the programming language and other syntaxes used to create and format the custom transition procedures 512, and uses the list of transitions 508 to determine the identity and location of the procedure 512 that is associated with the invoked command). Layout editor 514 further includes conventional functionality for receiving and updating layout information (e.g., GDS II data) for the current design in layouts 518 in response to the user actions.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method for controlling a design tool adapted for modifying a design of an integrated circuit comprising a plurality of layers, the method comprising:
    updating the design tool to include a single command that is accessible by a user of the design tool during a design process for the integrated circuit;
    identifying a first multi-layer bus section in the design comprising a number of N wires in a number of M of the plurality of layers; and
    in response to the single command invoked by the user of the design tool, transitioning the first multi-layer bus section to a second multi-layer bus section in the design comprising the number of N wires in a number of M' of the plurality of layers, wherein the numbers M and M' are not necessarily the same, but wherein certain of the N wires in the first multi-layer bus section transition to different layers in the second multi-layer bus section,
    wherein updating the design tool includes:
        allowing a designer to write a custom transition procedure that specifies the transition from the first multi-layer bus section to the second multi-layer section; and
        enabling the design tool to access the custom transition procedure in response to invoking the single command during operation of the design tool,
    wherein updating the design tool further includes enabling the single command to be invoked using a new user interface mechanism that is added to a user interface of the design tool.

2. The method of claim 1, wherein the process further includes causing the custom transition procedure to be saved in a human-readable text file, and wherein enabling includes loading the human-readable text file in the design tool.

3. The method of claim 1, wherein enabling further includes populating the user interface of the design tool with the single command and binding the single command with the custom transition procedure.

4. The method of claim 1, further comprising, before the user is allowed to invoke the single command, exposing the single command to the user during a context of operation of the design tool.

5. The method of claim 1, wherein transitioning includes, by the design tool, inserting vias in the design between certain of the N wires in the first multi-layer bus section and the second multi-layer bus section.

6. The method of claim 1, wherein transitioning includes, by the design tool, creating shapes in the design corresponding to the N wires in the second multi-layer bus section in appropriate layers of the integrated circuit.

7. The method of claim 1, wherein the design tool is a layout editor tool.

8. A computer readable storage medium having instructions stored thereon, which when executed by a computer, cause the computer to perform a method for modifying a design of an integrated circuit comprising a plurality of layers, the method comprising:
    identifying a first multi-layer bus section in the design comprising a number of N wires in a number of M of the plurality of layers;
    in response to a single command invoked by a user of a design tool, transitioning the first multi-layer bus section to a second multi-layer bus section in the design comprising the number of N wires in a number of M' of the plurality of layers, wherein the numbers M and M' are not necessarily the same, but wherein certain of the N wires in the first multi-layer bus section transition to different layers in the second multi-layer bus section;
    updating the design of the integrated circuit to include the second multi-layer bus section, wherein the design comprises one or more computer readable files; and,
    providing a process for creating the single command, wherein the single command is invoked by the user via a user interface of the design tool, wherein the process includes enabling the single command to be invoked in the user interface, and wherein the process includes:
        allowing a designer to write a custom transition procedure that specifies the transition from the first multi-layer bus section to the second multi-layer section; and
        enabling the design tool to access the custom transition procedure in response to invoking the single command during operation of the design tool.

9. The computer readable storage medium of claim 8, wherein the process further includes causing the custom transition procedure to be saved in a human-readable text file, and wherein enabling includes loading the human-readable text file in the design tool.

10. The computer readable storage medium of claim 8, further comprising, before the user is allowed to invoke the single command, exposing the single command to the user during a context of operation of the design tool.

11. The computer readable storage medium of claim 8, wherein updating includes, by the design tool, inserting vias in the design between certain of the N wires in the first multi-layer bus section and the second multi-layer bus section.

12. A system comprising:
    an EDA tool comprising one or both of interactive and automated modules for interactively modifying a design of an integrated circuit comprising a plurality of layers; and
    a custom transition tool that communicates with the EDA tool to allow a user of the EDA tool to create one or more custom transitions that are made available in a user interface of the EDA tool,
    wherein the custom transitions allow a user of the EDA tool, via the user interface, to identify a first multi-layer bus section in the design comprising a number of N wires in a number of M of the plurality of layers, and in response to a single command invoked by a user of the EDA tool via the user interface, transition the first multi-layer bus section to a second multi-layer bus section in the design comprising the number of N wires in a number of M' of the plurality of layers, wherein the numbers M and M' are not necessarily the same, but wherein certain of the N wires in the first multi-layer bus section transition to different layers in the second multi-layer bus section, and wherein the EDA tool is configured to update the design of the integrated circuit to include the second multi-layer bus section, wherein the design comprises one or more computer readable files, wherein the custom transition tool includes functionality for allowing a designer to write a custom transition procedure that specifies the transition from the first multi-layer bus section to the second multi-layer section, and wherein the EDA tool is configured to access the custom transition procedure in response to invoking the single command during operation of the EDA tool.

13. The system of claim 12, wherein the custom transition tool further includes functionality for causing the custom transition procedure to be saved in a human-readable text file that is accessible by the EDA tool.

* * * * *